United States Patent
Yoon

(10) Patent No.: US 9,502,648 B2
(45) Date of Patent: Nov. 22, 2016

(54) SEMICONDUCTOR APPARATUS WITH VARIABLE RESISTOR HAVING TAPERED DOUBLE-LAYERED SIDEWALL SPACERS AND METHOD FOR FABRICATING THE SAME

(71) Applicant: SK hynix Inc., Gyeonggi-do (KR)

(72) Inventor: Jae Sung Yoon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/566,305

(22) Filed: Dec. 10, 2014

(65) Prior Publication Data
US 2016/0079525 A1    Mar. 17, 2016

(30) Foreign Application Priority Data
Sep. 11, 2014 (KR) .................. 10-2014-0120373

(51) Int. Cl.
*H01L 45/00* (2006.01)
*H01L 27/24* (2006.01)
*H01L 27/22* (2006.01)

(52) U.S. Cl.
CPC ......... *H01L 45/1233* (2013.01); *H01L 27/222* (2013.01); *H01L 27/2463* (2013.01); *H01L 45/04* (2013.01); *H01L 45/06* (2013.01); *H01L 45/1246* (2013.01); *H01L 45/14* (2013.01); *H01L 45/141* (2013.01); *H01L 45/147* (2013.01); *H01L 45/1683* (2013.01)

(58) Field of Classification Search
CPC ............... H01L 45/12; H01L 45/1233; H01L 45/1253; H01L 45/1683; H01L 45/1691; H01L 45/124
See application file for complete search history.

(56) References Cited

U.S. PATENT DOCUMENTS

2006/0125108 A1* 6/2006 Gutsche et al. .............. 257/774
2012/0292671 A1* 11/2012 Baars et al. .................. 257/288

FOREIGN PATENT DOCUMENTS

KR    1020140127576    11/2014

* cited by examiner

*Primary Examiner* — Kevin Parendo
(74) *Attorney, Agent, or Firm* — I P & T Group LLP

(57) ABSTRACT

A method for fabricating a semiconductor apparatus includes forming a variable resistor region, and forming a spacer having a top linewidth and a bottom linewidth substantially equal to each other in the variable resistor region. The forming of the spacer includes forming a first insulating layer in the variable resistor region through a first method, forming a second insulating layer along a surface of the first insulating layer in the variable resistor region through a second method for providing step coverage superior to the first method, and etching the first and second insulating layers.

6 Claims, 4 Drawing Sheets

SEMICONDUCTOR APPARATUS WITH VARIABLE RESISTOR HAVING TAPERED DOUBLE-LAYERED SIDEWALL SPACERS AND METHOD FOR FABRICATING THE SAME

CROSS-REFERENCES TO RELATED APPLICATION

This application claims priority under 35 U.S.C. 119(a) to Korean application No. 10-2014-0120373, filed on Sep. 11, 2014, in the Korean intellectual property Office, which is incorporated by reference in its entirety as set forth in full.

BACKGROUND

1. Technical Field

Various embodiments of the inventive concept relate to a semiconductor apparatus having resistance variable characteristics, and a method for fabricating the same.

2. Related Art

With the rapid development of mobile and digital information communication and consumer-electronic industries, studies on existing electronic charge-controlled devices may encounter limitations. Thus, new functional memory devices other than the existing electronic charge-controlled devices need to be developed. In particular, next-generation memory devices with large capacity, ultra-high speed, and ultra-low power need to be developed to satisfy demands on large capacity of memories in main information apparatuses.

Currently, variable resistive memory devices using a resistance material as a memory medium have been suggested as the next-generation memory devices. Typically examples of the resistance variable memory device are phase-change random access memories (PCRAMs), resistive RAMS (ReRAMs), magneto-resistive RAMs (MRAMs), and spin-transfer torque magnetoresistive RAMS (STTMRAMs).

The variable resistive memory device may include a semiconductor substrate having a switching device, a lower electrode, a variable resistor device, and an upper electrode. As the design rule is scaled down, the lower electrode, the variable resistor device, and the upper electrode may be formed in a hole having a fine size.

For example, the variable resistor device may be mainly formed through a method of forming an interlayer insulating layer on the semiconductor substrate including the lower electrode, forming a hole in the interlayer insulating layer, and gap-filling the hole with a variable resistance material. In particular, technology for reducing a reset current through reduction in a contact area between the variable resistor device and the lower electrode had been suggested in the related art.

However, in the variable resistive memory device of the related art, the variable resistor device is formed in the hole, and thus the process of forming the variable resistor device is complicated.

SUMMARY

One or more exemplary embodiments are to provide a semiconductor apparatus and a method for fabricating the same, which easily form a variable resistor device.

According to an embodiment, there is provided a method for fabricating a semiconductor apparatus. The method may include forming a variable resistor region, and forming a spacer having a top linewidth and a bottom linewidth substantially equal to each other in the variable resistor region.

The forming of the spacer may include forming a first insulating layer in the variable resistor region through a first method, forming a second insulating layer along a surface of the first insulating layer in the variable resistor region through a second method for providing step coverage superior to the first method, and etching the first and second insulating layers.

According to an embodiment, there is provided a semiconductor apparatus. The semiconductor apparatus may include a lower electrode, a variable resistor device including a first variable resistor device formed on the lower electrode and having a top linewidth and a bottom linewidth substantially equal to each other and a second variable resistor device formed on the first variable resistor device and having a linewidth larger than that of the first variable resistor device, and a spacer formed on an outer circumference of the first variable resistor device.

These and other features, aspects, and embodiments are described below in the section entitled "DETAILED DESCRIPTION".

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Figure 1:
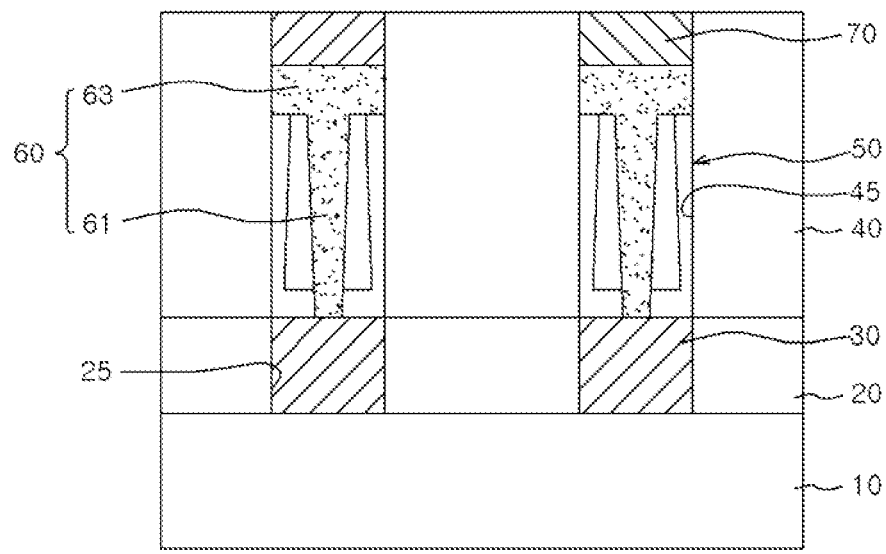
FIG. 1 is a cross-sectional view illustrating a semiconductor apparatus according to an embodiment of the inventive concept.

Exemplary embodiments will be described in greater detail with reference to the accompanying drawings. Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form, and vice versa as long as it is not specifically mentioned.

The inventive concept is described herein with reference to cross-section and/or plan illustrations that are schematic illustrations of idealized embodiments of the inventive concept. However, embodiments of the inventive concept should not be limited construed as limited to the inventive concept. Although a few embodiments of the inventive concept will be shown and described it will be appreciated by those of ordinary skill in the art that changes may be made in these exemplary embodiments without departing from the principles and spirit of the inventive concept.

FIG. 1 is a cross-sectional view illustrating a semiconductor apparatus according to an embodiment.

Referring to FIG. 1, a semiconductor apparatus according to an embodiment may include a semiconductor substrate 10, a lower electrode 30, a variable resistor device 60, and an upper electrode 70 which are sequentially formed over the semiconductor substrate 10.

A switching device (not shown) may be formed between the semiconductor substrate 10 and the lower electrode 30. The switching device is a well-known device, and thus, a detailed description thereof will be omitted.

The lower electrode 30 may be formed in a hole 25 of a first interlayer insulating layer 20, which is formed over the semiconductor substrate 10. The lower electrode 30 may be electrically coupled to the switching device. The lower electrode 30 may include a doped polysilicon layer or a metal material having high resistivity. For example, the lower electrode 30 may include titanium nitride (TiN).

The variable resistor device 60 may be formed in the hole 45, which is formed in a second interlayer insulating layer 40 to be electrically coupled to the lower electrode 30. A variable resistance material for the variable resistor device 60 may include various materials such as a PCMO ($Pr_{1-x}Ca_xMnO_3$) layer for a ReRAM, a chalcogenide layer for a PCRAM, a magnetic layer for a MRAM, magnetization reversal device layer for a STTMRAM, or a polymer layer for a polymer RAM (PoRAM). However, the material for the variable resistor device 60 is not limited thereto, and may include any material having a variable resistance characteristic in which the variable resistor device is switched between different resistance states according to a voltage or current applied thereto.

The variable resistor device 60 may include a first variable resistor device 61 and a second variable resistor device 63. The first variable resistor device 61 is formed within the spacer 50. The spacer 50 has a ring shape and is formed in the hole 45. A second variable resistor device 63 is formed on the spacer 50 and the first variable resistor device 61 is formed in the hole 45. In an embodiment, the first variable resistor device 61 and the second variable resistor device 63 may be coupled to each other. In an embodiment, the first variable resistor device 61 and the second variable resistor device 63 may be formed in a single body, but the first variable resistor device 61 and the second variable resistor device 63 may have different widths from each other. The first variable resistor device 61 is switched between different resistance states according to voltages or currents applied thereto, exhibiting variable resistance characteristics.

A spacer 50 may be formed in the hole 45 and formed in a ring shape as described above. In other words, the spacer 50 has a uniform width from a top to a bottom of the spacer 50. To rephrase, a top width and a bottom width of the spacer 50 are substantially the same as each other, and thus the ring-shaped spacer 50 has a uniform inner diameter.

Since the spacer 50 has a substantially uniform inner diameter, the first variable resistor device 61, which is formed inside the spacer 50, also has a substantially uniform diameter. That is, the spacer 50 serves to reduce a bottom cross-sectional area of the variable resistor device 60, which is in contact with the lower electrode 30, thus reducing the reset current.

The upper electrode 70 may be formed on the variable resistor device 60 in a hole 45. The upper electrode 70 may also include a doped polysilicon layer or a metal material having high resistivity like the lower electrode 30. For example, the upper electrode 70 may include titanium nitride (TiN).

FIGS. 2 to 7 are cross-sectional views illustrating a method for fabricating a semiconductor apparatus according to an embodiment.

Figure 2:
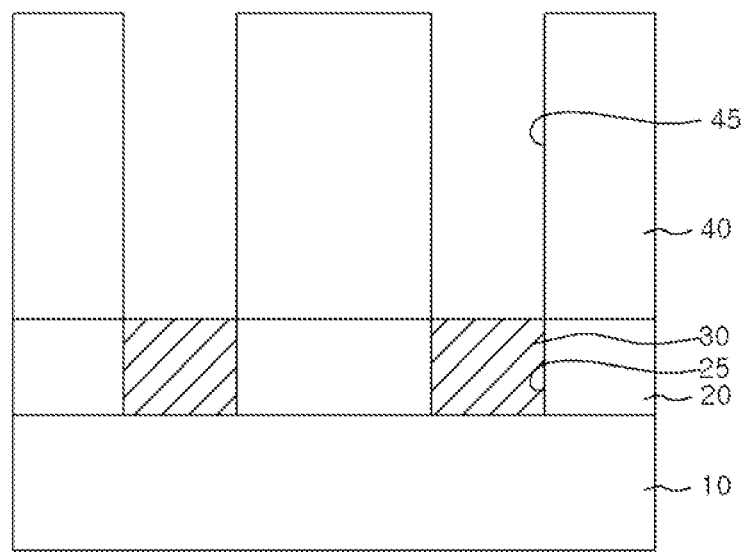
FIG. 2 is a cross-sectional view illustrating a method for fabricating a semiconductor apparatus according to an embodiment of the inventive concept.

Referring to FIG. 2, a first interlayer insulating layer 20 is formed on a semiconductor substrate 10, and a predetermined portion of the first interlayer insulating layer 20 is etched to form a hole 25. A conductive material is gap-filled in the hole 25 to form a lower electrode 30. At this time, the lower electrode 30 may be electrically coupled to a switching device (not shown) formed in the semiconductor substrate 10.

A second interlayer insulating layer 40 is formed on the semiconductor substrate in which the lower electrode 30 is formed, and then etched to form a hole 45 so that a surface of the lower electrode 30 is exposed. The hole 45 may correspond to a variable resistor region in which a variable resistor device (see 60 of FIG. 6) is formed.

Figure 3:
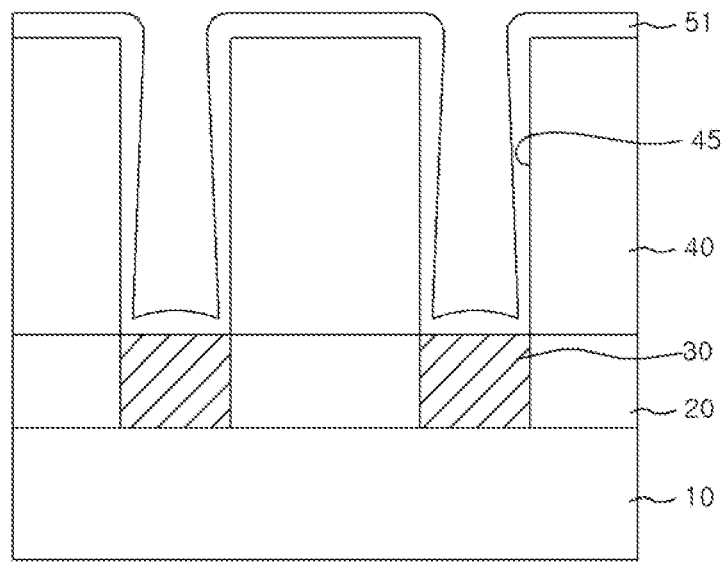
FIG. 3 is a cross-sectional view illustrating a method for fabricating a semiconductor apparatus according to an embodiment of the inventive concept.

Referring to FIG. 3, a first insulating layer 51 is thinly deposited on the semiconductor substrate in which the hole 45 is formed. The first insulating layer 51 may include a material including silicon nitride or nitride, but the material for the first insulating layer 51 is not limited thereto.

The first insulating layer 51 may be deposited through a first method. The first method may be a physical vapor deposition (PVD) method. The first insulating layer 51 disposed through the above-described PVD method may have a shape in which a width of the first insulating layer 51 tapers (i.e., gets thinner) going from a top toward a bottom of the first insulating layer 51. However, the first insulating layer 51 is formed not to block a top of the hole 45.

Figure 4:
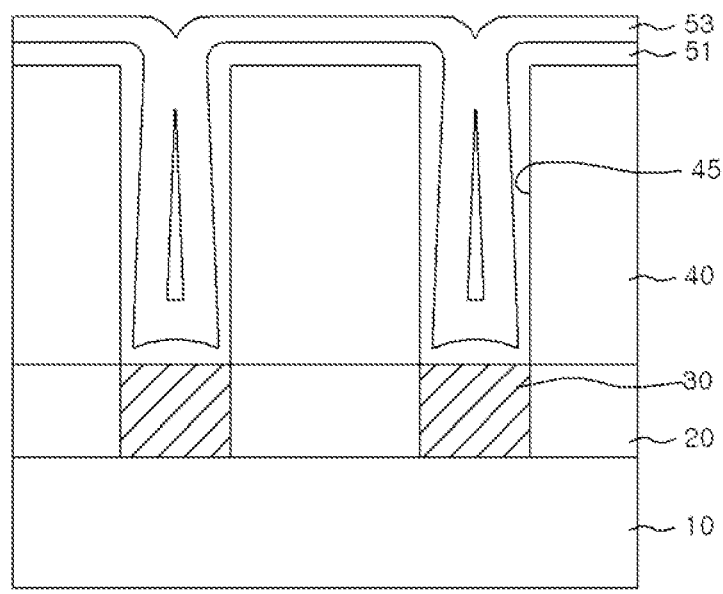
FIG. 4 is a cross-sectional view illustrating a method for fabricating a semiconductor apparatus according to an embodiment of the inventive concept.

Referring to FIG. 4, a second insulating layer 53 is deposited on the semiconductor substrate in which the first insulating layer 51 is formed. The second insulating layer 53 may include a material having substantially the same etch selectivity as the first insulating layer 51. For example, the second insulating layer 53 may include a material including a silicon nitride or nitride, but the material for the second insulating layer 53 is not limited thereto.

The second insulating layer 53 may be deposited through a second method for providing step coverage superior to the first insulating layer 51. The second method may be a chemical vapor deposition (CVD) method or an atomic layer deposition (ALD) method.

The second insulating layer 53 deposited through a CVD method or an ALD method has step coverage superior to the first insulating layer 51 deposited through the PVD method, and thus the second insulating layer 53 may be formed to a uniform width in the hole 45. More specifically, the second insulating layer 53 may be deposited along a surface of the first insulating layer 51 in the hole 45 to a uniform width. As a result, a space or a seam may be formed within the second insulating layer 53. The seam may increase in size going from a top toward a bottom of the hole 45.

Figure 5:
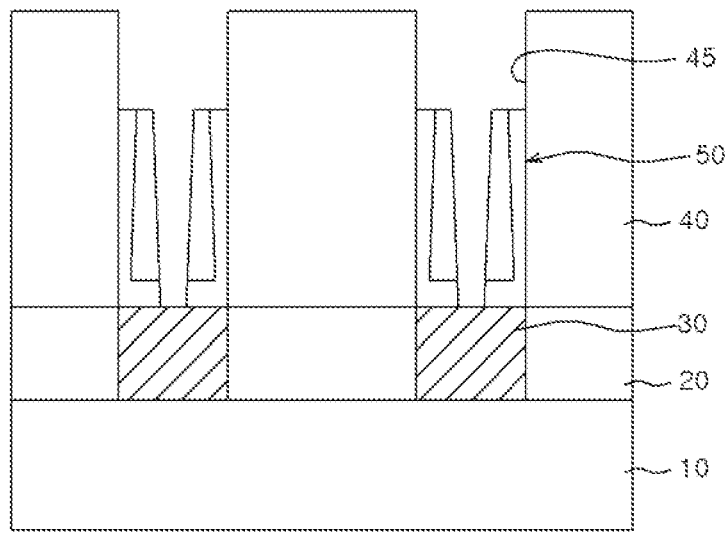
FIG. 5 is a cross-sectional view illustrating a method for fabricating a semiconductor apparatus according to an embodiment of the inventive concept.

Referring to FIG. 5, the first insulating layer 51 and the second insulating layer 53 are anisotropically etched to form a spacer 50 on a sidewall of the hole 45. Further, the first insulating layer 51 and the second insulating layer 53 may be etched so that the spacer 50 may have a height lower than that of the hole 45. The spacer 50 may be formed in a ring shape. The spacer 50 may be formed to have a substantially uniform width from a top to a bottom of the spacer 50, thus creating a ring structure with a uniform inner diameter.

The process of forming the spacer 50 in a ring shape having a substantially uniform inner diameter as described above will be described in detail.

Generally, when the spacer 50 is formed, since upper portions of the first and second insulating layers 51 and 53 are exposed to an etching gas more than lower portions of the first and second insulating layers 51 and 53, the upper portions of the first and second insulating layers 51 and 53 are etched relatively more, and the lower portions of the first and second insulating layers 51 and 53 are etched relatively less.

In an embodiment, the space or the seam formed inside the first and second insulating layers 51 and 53 may have a width that increases toward the bottom of the hole 45. Therefore, even when the lower portions of the first and second insulating layers 51 and 53 are etched relatively less, compared to the upper portions of the first and second insulating layers 51 and 53 in the anisotropic etching process of the first and second insulating layers 51 and 53, the spacer 50 in a ring shape with a substantially uniform inner diameter can be obtained.

Figure 6:
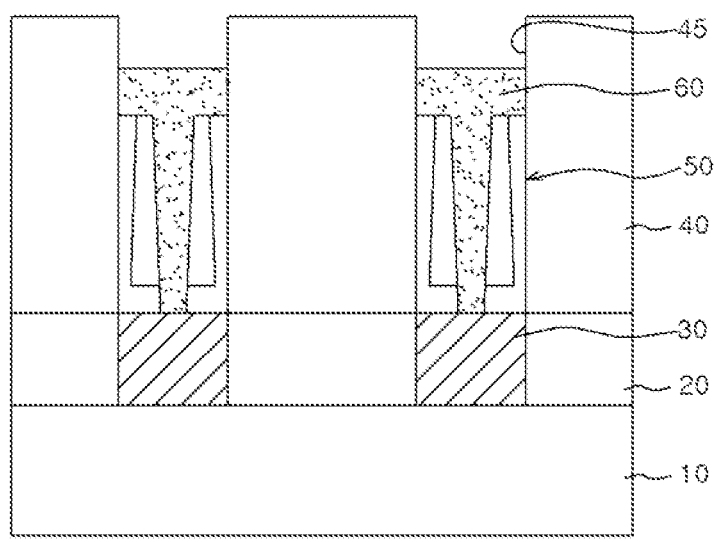
FIG. 6 is a cross-sectional view illustrating a method for fabricating a semiconductor apparatus according to an embodiment of the inventive concept.

Referring to FIG. 6, a variable resistance material is gap-filled in the hole 45 in which the spacer 50 is formed, and then etched back to a predetermined height, and thus a variable resistor device 60 is formed.

Figure 7:
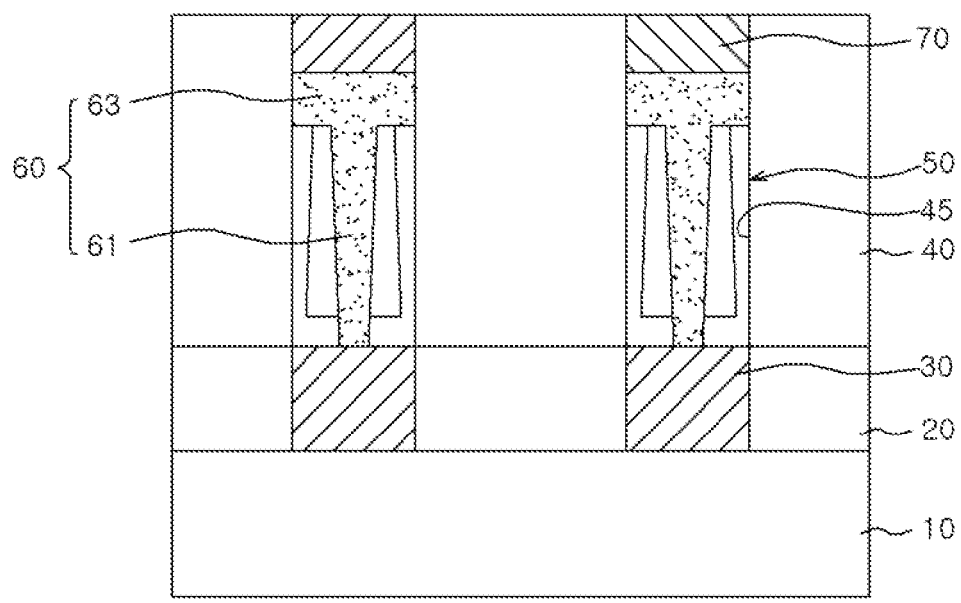
FIG. 7 is a cross-sectional view illustrating a method for fabricating a semiconductor apparatus according to an embodiment of the inventive concept.

Referring to FIG. 7, a conductive material is formed on the semiconductor substrate in which the variable resistor device 60 is formed, and then planarized to expose a surface of the second interlayer insulating layer 40, and thus an upper electrode 70 is formed.

As described above, in the semiconductor apparatus according to an embodiment, the first insulating layer 51 is formed in the hole 45 through a PVD method, and the second insulating layer 53 is formed along a surface of the first insulating layer 51 through a CVD method or an ALD method. Then, the first and second insulating layers 51 and 53 may be etched to form the spacer 50. Then, the variable resistor device 60 may be formed in the hole 45 in which the spacer 50 is formed.

In the semiconductor apparatus fabricated through the above-described method, even when the variable resistor device 60 is formed in a fine hole 45, the fabrication process is simple. In particular, in the embodiment, the process of forming the spacer 50 in the hole 45 is simplified, and thus the semiconductor apparatus may be easily fabricated.

In the semiconductor apparatus according to an embodiment of the inventive concept, the variable resistor device 60 including the first variable resistor device 61 may be formed using the spacer 50 having substantially a uniform inner diameter. In other words, the first variable resistor device 61, which is a region in which the resistance is switched, may be formed to have a top linewidth and a bottom linewidth substantially equal to each other. When the first variable resistor device 61 is formed to have the top linewidth and the bottom linewidth substantially equal to each other as described above, the resistance for activating the first variable resistor device 61 is increased, and thus the resistance may be easily varied even in the low current. That is, the reset current flowing through the variable resistor device may be reduced.

The above embodiment of the present invention is illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A method for fabricating a semiconductor apparatus, the method comprising:
    forming a lower electrode on a semiconductor substrate;
    forming an interlayer insulating layer on the semiconductor substrate;
    etching the interlayer insulating layer thus exposing an upper surface of the lower electrode, thereby forming a variable resistor region;
    non-conformally forming a first insulating layer along the interlayer insulating layer and the exposed lower electrode using a PVD (physical vapor deposition) method;
    conformally forming a second insulating layer over a surface of the first insulating layer using a CVD (chemical vapor deposition) or an ALD (atomic layer deposition);
    etching the first and the second insulating layers, thereby forming a spacer in the variable resistor region;
    forming a variable resistor device, which is in contact with the lower electrode, in the variable resistor region in which the spacer is formed; and
    forming an upper electrode over the variable resistor device to be coupled to the variable resistor device.

2. The method of claim 1,
    wherein the first insulating layer extends vertically with respect to a surface of the semiconductor substrate, and
    wherein the first insulating layer has a width tapering from a top toward a bottom of the first insulating layer.

3. The method of claim 1,
    wherein the second insulating layer extends vertically with respect to a surface of the semiconductor substrate, and
    wherein the second insulating layer has a uniform width from a top to a bottom of the second insulating layer.

4. The method of claim 3,
    wherein the forming of the second insulating layer includes forming a seam inside the second insulating layer, and
    wherein the seam increases in size as going from a top toward a bottom of the second insulating layer.

5. The method of claim 4,
    wherein the etching of the first and the second insulating layers includes etching the first and the second insulating layers in such a manner that upper portions of the first and the second insulating layers are etched more than lower portions of the first and the second insulating layers.

6. The method of claim 1, wherein the first insulating layer and the second insulating layer include a silicon nitride material.

* * * * *